United States Patent [19]

Aihara et al.

[11] Patent Number: 4,918,358

[45] Date of Patent: Apr. 17, 1990

[54] APPARATUS USING CHARGED-PARTICLE BEAM

[75] Inventors: Ryuzo Aihara; Haruo Kasahara, both of Tokyo, Japan

[73] Assignee: Jeol, Ltd., Tokyo, Japan

[21] Appl. No.: 215,739

[22] Filed: Jul. 6, 1988

[30] Foreign Application Priority Data

Jul. 14, 1987 [JP] Japan .................................. 62-175633
Oct. 16, 1987 [JP] Japan .................................. 62-261036

[51] Int. Cl.$^4$ .............................................. G21G 1/00
[52] U.S. Cl. .................. 315/111.81; 250/427; 250/492.2
[58] Field of Search ............... 250/427, 492.3, 492.2, 250/492.1, 423 R; 315/111.81

[56] References Cited

U.S. PATENT DOCUMENTS 4,084,095  4/1978  Wolfe ................................. 250/492.2
4,710,632 12/1987  Ishitani et al. .................. 250/492.2 X
4,748,327  5/1988  Shinozaki et al. ............. 250/492.2 X
4,835,399  5/1989  Hosaka et al. ................... 250/492.2

OTHER PUBLICATIONS

"Retarding Field Optics for Practical Electron Beam Lithography" by T. H. Newman and R. F. W. Pease, SPIE, vol. 471, Electron-Beam, X-Ray, and Ion-Beam Techniques for Submicrometer Lithographies III (1984), pp. 25-30.

Primary Examiner—Eugene R. LaRoche
Assistant Examiner—Do Hyun Yoo
Attorney, Agent, or Firm—Webb, Burden, Ziesenheim & Webb

[57] ABSTRACT

An emitter produces a beam of electrons or ions accelerated at a relatively high accelerating voltage. The beam is sharply focused by a condenser lens at the final stage. An electrostatic field for retarding the beam is produced between the lens at the final stage and a target on which the beam impinges. The retarding field lowers the landing energy of the beam. An auxiliary electrode which is maintained at substantially the same potential as the target is disposed between the lens and the target. A secondary electron detector is mounted between the auxiliary electrode and the target.

11 Claims, 3 Drawing Sheets

APPARATUS USING CHARGED-PARTICLE BEAM

FIELD OF THE INVENTION

The present invention relates to an apparatus making use of a charged-particle beam such as an electron beam or ion beam and, more particularly, to an apparatus using such a charged-particle beam and having an electrostatic retarding field.

BACKGROUND OF THE INVENTION

In an apparatus using a charged-particle beam for electron-beam lithography or ion-beam lithography, an electron beam or ion beam is directed to a target. Sometimes, the position at which the beam strikes the target is shifted to write a desired pattern. In another application, secondary electrons or other radiation produced by the irradiation of the beam is detected to observe the surface of the target. Where the beam is accelerated at a high accelerating voltage of 30 to 50 KV to irradiate the target, the high energy of the beam etches away the surface of the target changing the topographical features of the surface of the target. Therefore, reducing the accelerating voltage may be contemplated to decrease the landing energy. However, lowering the accelerating voltage makes it impossible to finely focus the beam with the condenser lenses. Consequently, quite accurate illumination of the beam cannot be accomplished, though the target is prevented from being etched.

Referring to FIG. 1, there is shown an improved apparatus utilizing an electron beam. This apparatus includes an electron gun 1 comprising a cathode 2, a Wehnelt electrode 3, and an accelerating electrode 4. An accelerating voltage source 5 supplies an accelerating voltage between the accelerating electrode 4 and the cathode 2. The electron beam emitted by the gun 1 is accelerated and then sharply focused onto a target 8 by a condenser lens 6 and an objective lens 7. The position on the target 8 at which the beam falls on it is moved by supplying a deflecting signal to a deflecting coil 9. A retarding field power supply 10 applies a voltage to the target 8 to retard the beam impinging on it.

The accelerating voltage source 5 applies an accelerating voltage, say −30 KV, to the cathode 2. The electron beam enters the condenser lens 6 and the objective lens 7 with relatively high energy. Therefore, the beam is finely focused on the target 8. Since the power supply 10 applies a retarding voltage of −27 KV, for example, to the target 8, a retarding electric field is set up between the objective lens 7 and the target 8 to retard the beam impinging on the target 8. That is, the electron landing voltage is substantially 3 KV.

Thus, in this apparatus, the electron beam enters the condenser lens and the objective lens with high energy and so it can be focused sharply. Then, it strikes the target 8 with low energy, preventing the surface of the target from being etched away. Hence, the target can be continuously irradiated with the beam without varying the shape of the surface of the target.

In the aforementioned configuration, the retarding electric field is produced between the objective lens 7 and the target 8. If the surface of the target 8 is irregular, then the retarding field is disturbed and becomes nonuniform. This makes it difficult to accurately focus the beam. Another problem arises from the fact that the target 8 is exposed to the retarding electric field. If a very weak electric discharge takes place between the target and the objective lens, then the target may be damaged. Where a microchannel plate which is put at ground potential and serves as a secondary electron detector is disposed near the target, secondary electrons emanating from the target are accelerated at a high voltage of 27 KV and hit the detector. For this reason, the detector deteriorates in performance rapidly.

This improved apparatus is disclosed in an article entitled "Retarding field optics for practical electron beam lithography", T. H. Newman and R. F. W. Pease, SPIE Vol. 471, *Electron-Beam, X-ray, and Ion-beam Techniques for Submicrometer Lithographies III* (1984).

FIG. 2 shows another apparatus producing an ion beam and having an electrostatic retarding field. This apparatus includes an ion gun 14 consisting of an ion emitter 11, an extraction electrode 12, and an accelerating electrode 13. The ion beam generated and accelerated by the gun is sharply focused onto a target 17 by a condenser lens 15 and an objective lens 16. The lenses 15 and 16 each consist of an einzel lens. The condenser lens 15 has an electrode 15a at it center. A voltage source 18 applies a lens voltage to the central electrode 15a. Also, the objective lens 16 is centrally equipped with an electrode 16a on which a lens voltage is supplied from a voltage source 19. The lenses 15 and 16 have outer electrodes 15b and 16b, respectively, which are grounded. Another voltage source 20 imposes a retarding voltage on the target 17.

In this structure, an accelerating voltage source 21 applies an accelerating voltage of 30 KV, for example, to the emitter 11. The ion beam is accelerated at an accelerating voltage of +30 KV and enters the objective lens 16 with high energy. The lens 16 sharply focuses the beam. The target 17 is applied with a retarding voltage of +27 KV from the voltage source 20. As a result, a retarding electric field is produced between the target 17 and the grounded outer electrode 16b of the objective lens 16. The ion beam is retarded and impinges on the target 17. That is, the ion landing voltage is substantially −3 KV.

In this instrument, the ion beam enters the electrostatic lenses with high energy and so it is finely focused. However, the ion landing energy is made low. This prevents the surface of the target from being etched. Consequently, the position on the target 17 at which the sharply focused beam hits the target can be controlled quite accurately without changing the topographical features of the surface of the target.

When the surface of the target is observed with the ion beam, or when a mark on the target is detected in ion-beam lithography, secondary electrons produced as a result of bombardment of the target by the incident beam must be detected. However, in the above-described apparatus, secondary electrons emanating from the target are attracted back to the target 17, because the retarding field is set up between the objective lens 16 and the target 17, thus making the potential at the target 17 higher than the potential at the objective lens 16. Hence, such secondary electrons cannot be detected even if a detector is positioned close to the target.

SUMMARY OF THE INVENTION

It is a main object of the invention to provide an apparatus which utilizes a charged-particle beam, has a retarding electric field, and is capable of efficiently detecting secondary electrons.

It is another object of the invention to provide an apparatus which produces an electron beam, has a retarding electric field, and is able to accurately focus the beam even if the surface of the target is irregular.

These objects are achieved in accordance with the teachings of the invention by an apparatus comprising: an emitter producing a charged-particle beam; an accelerating electrode for accelerating the beam; a lens for focusing the accelerated beam onto a target; a means for producing a retarding electric field between the lens and the target; and an auxiliary electrode which is disposed between the lens and the target and maintained at substantially the same potential as the target.

DETAILED DESCRIPTION OF THE PREFERRED EMBODIMENTS

Figure 1:
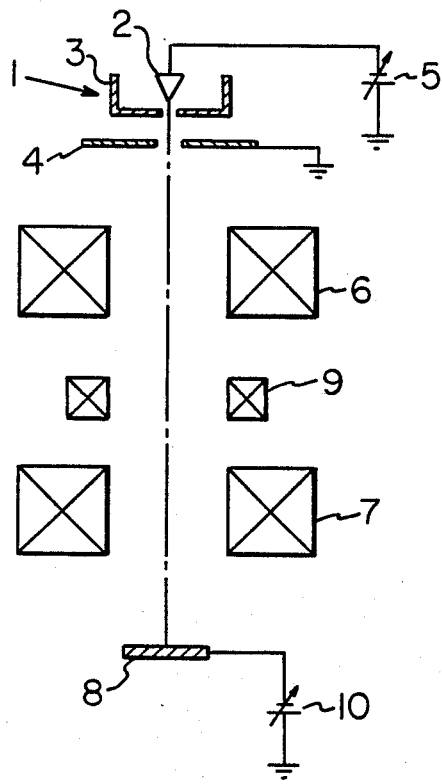
FIG. 1 is a schematic diagram of a conventional apparatus using an electron beam and having a retarding electric field.
Figure 2:
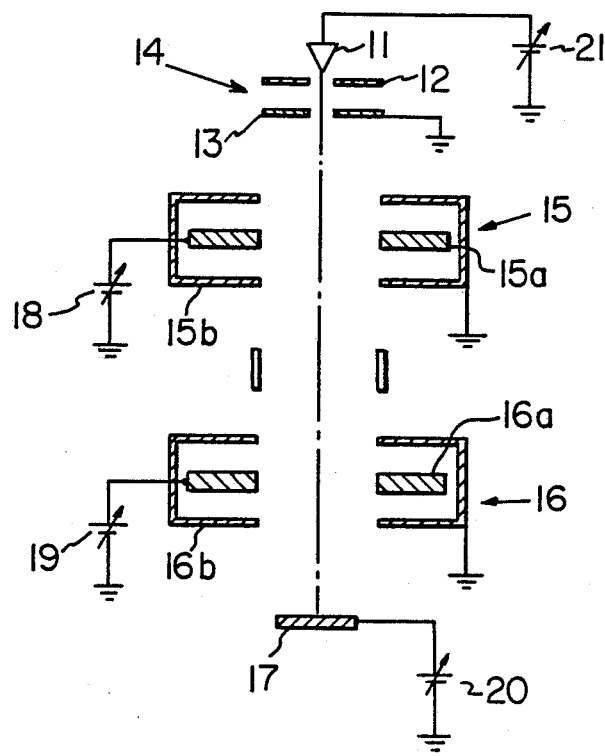
FIG. 2 is a schematic diagram of a conventional apparatus using an ion beam and having a retarding electric field.
Figure 3:
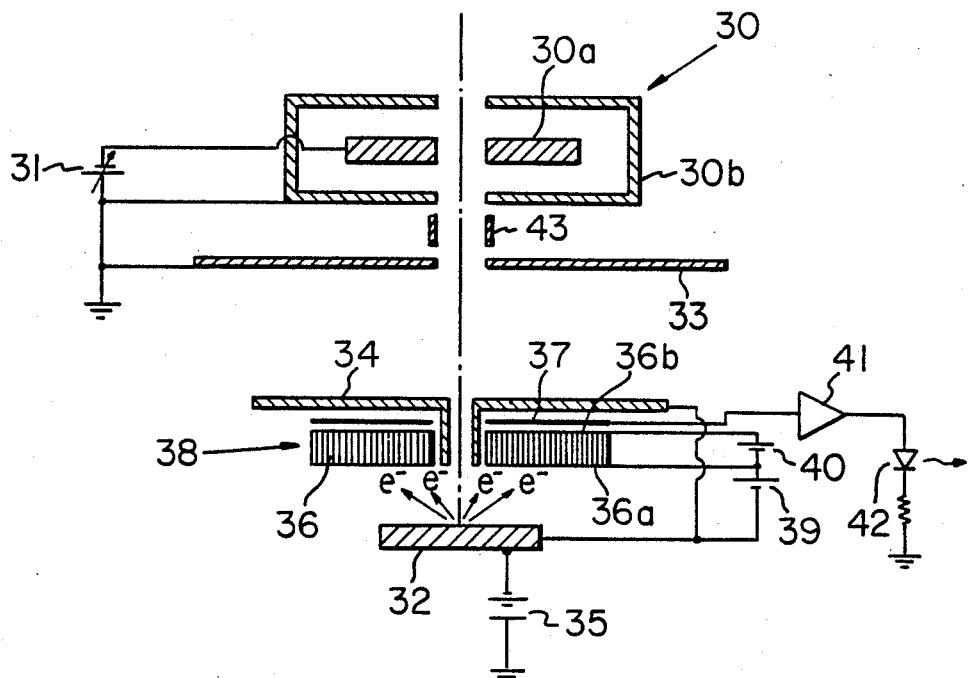
FIGS. 3 and 4 are schematic diagrams of an apparatus utilizing an electron beam and fabricated in accordance with the invention.

Referring to FIG. 3, there is shown an apparatus making use of an electron beam and built in accordance with the invention. This apparatus includes an objective lens 30 consisting of an electrostatic lens. The lens 30 has a central electrode 30a to which a lens voltage is applied from a voltage source 31. The lens 30 further includes an outer electrode 30b that is grounded. A field-moderating electrode 33 and an auxiliary electrode 34 are mounted between the objective lens 30 and a target 32. A voltage source 35 applies a retarding voltage to the target 32. The moderating electrode 33 is retained at the same potential as the outer electrode 30b of the objective lens 30 i.e., at ground potential. The surface of the electrode 34 is polished so as to be smooth. The auxiliary electrode 34 is maintained at the same potential 35 as the target 32. An equipotential space is formed between the auxiliary electrode 34 and the target 32. A secondary electron detector 38 consisting of a microcrochannel plate 36 and a detecting electrode 37 is located between the auxiliary electrode 34 and the target 32. A voltage of 200 V is applied between the incident face 36a of the plate 36 and the target 32 from a voltage source 39. Another voltage source 40 impresses a voltage of about 1 KV between the incident face 36a and the exit face 36b of the plate 36. The output signal from the detecting electrode 37 is amplified by a preamplifier 41 and fed to a light-emitting diode 42. A deflecting signal is supplied to a deflector 43 to deflect the electron beam traveling toward the target 32.

In the operation of the apparatus constructed as described above, bombardment of the target 32 by the electron beam produces secondary electrons, which are then attracted to the incident face 36a of the microchannel plate 36. The face 36a is at a positive potential that is higher than the potential at the target by 200 V. The electrons are multiplied and exit from the exit surface 36b. The resulting electrons are detected by the detecting electrode 37. The output signal from the detecting electrode 37 is amplified by the amplifier 41 and supplied to the light-emitting diode 42 that produces light the intensity of which depends on the intensity of the incident signal. The light emitted by the diode 42 is sent to a grounded light-receiving device through an optical fiber (not shown) to detect the emitted light.

The deflection field formed by supplying the deflecting signal to the deflector 43 is covered by the electrode 33 so that the retarding field between the electrode 33 and the auxiliary electrode 34 becomes rotationally symmetrical and uniform.

In the example shown in FIG. 3, the detector 38 using the microchannel plate is disposed in the equipotential space between the auxiliary electrode 34 and the target 32. The detector 38 can be replaced by a secondary electron detector employing a scintillator and a photomultiplier. Also, it is not required that the voltage applied to the auxiliary electrode 34 be strictly equal to the voltage applied to the target. Further, in the above example, a retarding voltage is applied to the target. Alternatively, the target 32 is put at ground potential, and a retarding voltage is applied to the outer electrode 30b of the objective lens.

As described above, the electric field for retarding the electron beam is produced between the field-moderating electrode 33 and the auxiliary electrode 34. The space between the auxiliary electrode 34 and the target 32 constitutes the equipotential space. Therefore, if the surface of the target 32 is irregular, the retarding field is not disturbed. Thus, it is unlikely that the electron beam is deflected incorrectly or that beam blurring takes place. In addition, no weak electric discharge occurs between the target 32 and other portions, since the target 32 is not exposed to the retarding field. Hence, the target is prevented from becoming damaged. Furthermore, the secondary electrons produced in response to the irradiation of the target by the electron beam are not accelerated at a high energy, because the retarding field is not close to the surface of the target. Consequently, the secondary electron detector does not rapidly deteriorate in performance.

Figure 4:
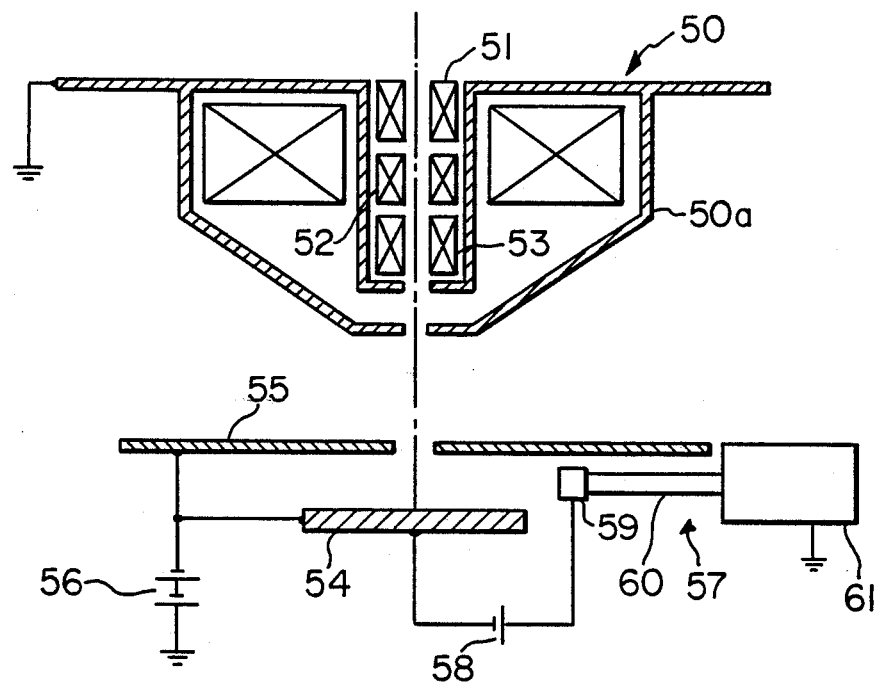

Referring next to FIG. 4, there is shown another apparatus using an electron beam and built in accordance with the invention. This apparatus includes an objective lens 50 of the magnetic type. The lens 50 has a grounded pole piece 50a. Further, deflecting and aligning coils 51, 52, 53 are placed inside the lens 50. A voltage source 56 applies a retarding voltage to a target 54 and also to an auxiliary electrode 55. A secondary electron detector 57 is composed of a scintillator 59, a light pipe 60, and a grounded photomultiplier 61. A voltage source 58 applies a voltage to the scintillator 59 so that the potential at this scintillator is higher than the potential at the target 54 by several kilovolts. This apparatus yields the same advantages as the apparatus shown in FIG. 3.

Figure 5:
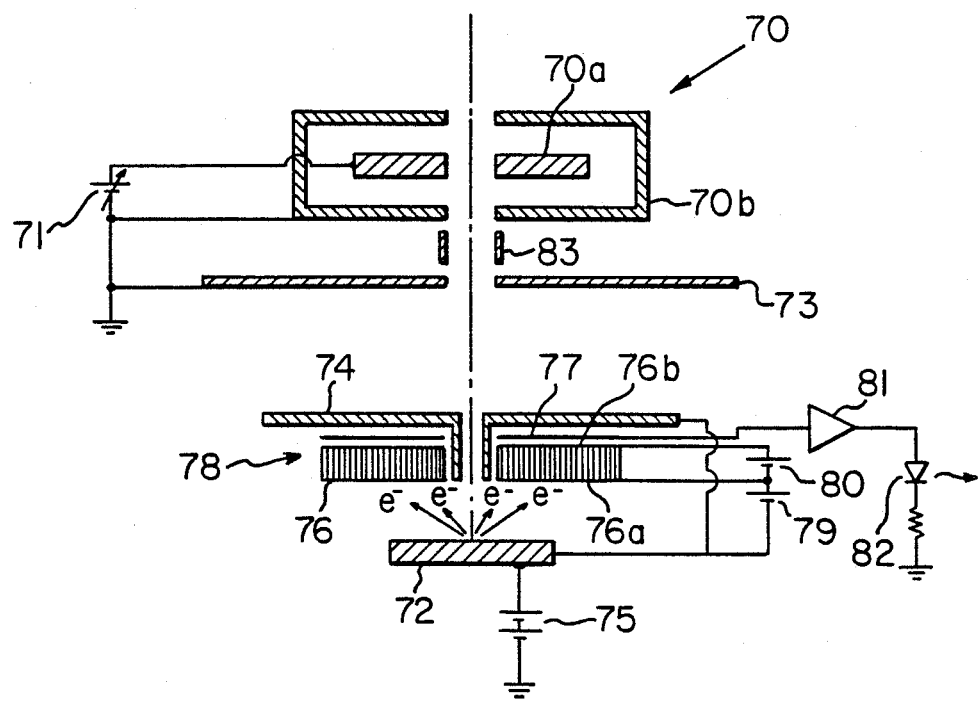
FIG. 5 is a schematic diagram of an apparatus utilizing an ion beam and fabricated in accordance with the invention.

Referring next to FIG. 5, there is shown an apparatus utilizing an ion beam and fabricated in accordance with the invention. This apparatus includes an objective lens 70 having a central electrode 70a to which a voltage source 71 applies a lens voltage. The lens 70 further includes an outer electrode 70b that is at ground potential. A field-moderating electrode 73 and an auxiliary electrode 74 are situated between the objective lens 70 and a target 72. A voltage source 75 applies a retarding voltage to the target 72. The moderating electrode 73 is kept at the same potential as the outer electrode 70b of the lens 70, i.e., at ground potential. The surface of the moderating electrode 73 is polished so as to be smooth. An equipotential space is formed between the auxiliary electrode 74 and the target 72. A secondary electron detector 78 consisting of a microchannel plate 76 and a detecting electrode 77 is mounted between the auxiliary electrode 74 and the target 72. The plate 76 has an incident face 76a on which secondary electrons impinge. A voltage source 79 applies a voltage of 200 V between the incident face 76a and the target 72. Another voltage source 80 applies a voltage of about 1 KV between the incident face 76a and the exit face 76b of the plate 76. The output signal from the detecting electrode 77 is amplified by a preamplifier 81 and fed to a light-emitting diode 82. A deflecting signal is supplied to a deflector 83 to deflect the ion beam traveling towards the target 72.

In the configuration as mentioned above, as the target 7 is irradiated with the ion beam, secondary electrons are produced. These electrons are attracted to the incident face 76a of the microchannel plate 76 that is at a positive potential of 200 V with respect to the target. The incident electrons are multiplied by the plate 76 and go out of the exit face 76b. The exiting electrons are detected by the detecting electrode 77. The output signal from the electrode 77 is amplified by the amplifier 81 and then supplied to the light-emitting diode 82. The magnitude of the light emitted by the diode 82 varies, depending on the intensity of the incident signal. The light is sent through an optical fiber (not shown) to a grounded light-receiving device, where the signal is detected.

As described above, the retarding electric field is formed between the field-moderating electrode 73 and the auxiliary electrode 74. An equipotential space is formed between the auxiliary electrode 74 and the target 72. Therefore, the secondary electrons generated in response to the bombardment of the target by the ion beam enter the microchannel plate without being attracted back to the target, the plate being applied with a voltage to collect the electrons. In this way, the secondary electrons are detected efficiently.

There is a potential difference of tens of kilovolts between the objective lens 70 and the auxiliary electrode 74. The field-moderating electrode 73 prevents the electric field from concentrating at the irregularities of the surfaces of the lens 70 and the deflector 83; otherwise dielectric breakdown would occur. Specifically, the surfaces of the electrode 73, especially the surface facing the auxiliary electrode 74, are polished so as to be smooth. Therefore, the electric field is moderated to thereby prevent the occurrence of dielectric breakdown.

Figure 6:
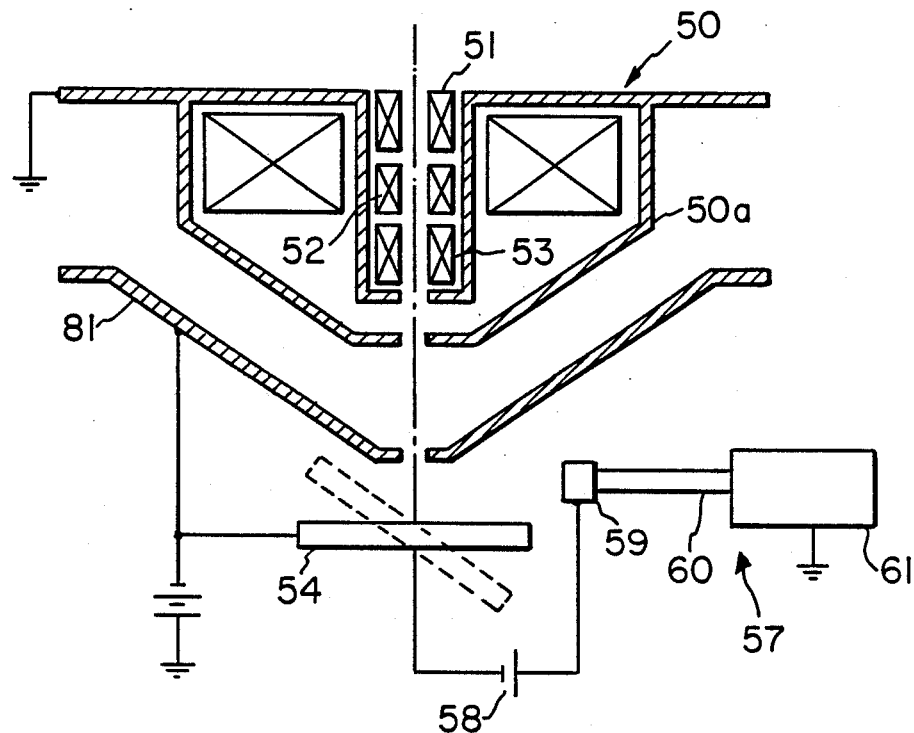
FIG. 6 is a schematic diagram of an apparatus according to this invention having a conical auxiliary electrode.

Referring next to FIG. 6, there is shown an improved apparatus which is similar to the apparatus shown in FIG. 4. In this apparatus, an auxiliary electrode 81, whose potential is the same as that of the target 54, is formed conically. Therefore, when the target 54 is tilted as shown by the dotted line in the drawing, the target 54 does not collide with the auxiliary electrode 81.

Figure 7:
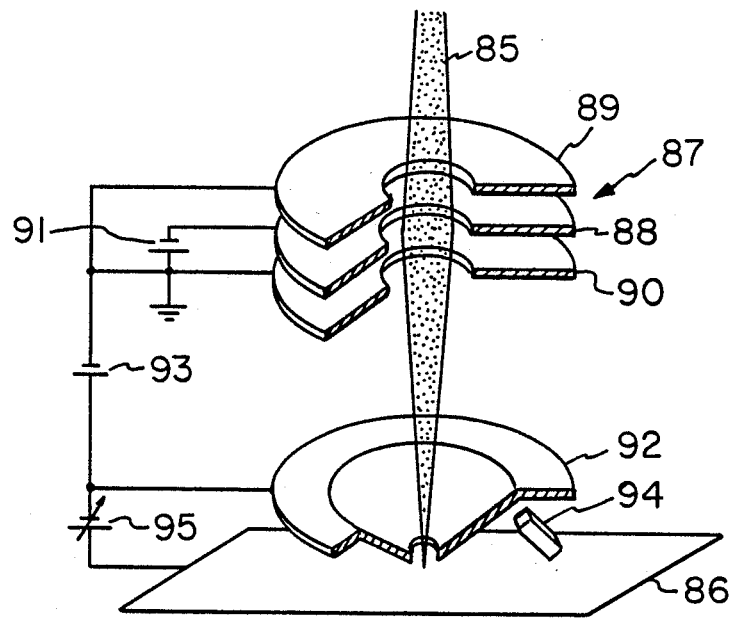
FIG. 7 is a schematic of a portion of yet another apparatus according to this invention.

Referring next to FIG. 7, there is another apparatus using an ion beam and built in accordance with the invention. In the apparatus, an ion beam 85 is focused on a target 86 by an objective lens 87 consisting of a central electrode 88, to which a lens voltage is applied by a voltage source 91, and outer electrodes 89 and 90 which are at ground potential. A voltage source 93 applies a retarding voltage to the target 86 and an auxiliary electrode 92. Secondary electrons emanated from the target 86 are detected by a microchannel plate 94. A voltage source 95 applies a voltage, for example, $-2$ V, to the auxiliary electrode 92 so that the potential of the auxiliary electrode 92 is slightly low compared with that of the target 86.

In the above arrangement, the secondary electrons emanated from the target 86 and traveling toward the auxiliary electrode 92 are repelled by the negative potential of the auxiliary electrode 92 and detected by the microchannel plate 94 efficiently.

Having thus described our invention with the detail and particularity required by the Patent Laws, what is desired and claimed protected by Letters Patent is set forth in the following claims.

We claim:

1. An apparatus using a charged-particle beam, comprising:
   an emitter producing a charged-particle beam;
   an accelerating electrode for accelerating the beam;
   a lens for focusing the accelerated beam onto a target;
   a means for producing a retarding electric field between the lens and the target; and
   an auxiliary electrode which is disposed between the lens and the target and maintained at substantially the same potential as the target.

2. An apparatus using a charged-particle beam, comprising:
   an emitter producing a charged-particle beam;
   an accelerating electrode for accelerating the beam;
   a lens for focusing the accelerated beam onto a target;
   a means for producing a retarding electric field between the lens and the target;
   an auxiliary electrode which is disposed between the lens and the target and maintained at substantially the same potential as the target; and
   a secondary electron detector disposed between the auxiliary electrode and the target.

3. The apparatus of claim 2, wherein said lens is an electrostatic lens having an outer electrode maintained at ground potential, and wherein said means for producing a retarding electric field comprises a retarding voltage applied to the target.

4. The apparatus of claim 2, wherein said lens is a lens of the magnetic field type having a magnetic pole piece maintained at ground potential, and wherein said means for producing a retarding electric field comprises a retarding voltage applied to the target.

5. The apparatus of claim 2, wherein said lens is an electrostatic lens having an outer electrode and said means for producing a retarding electric field comprises a retarding voltage applied to the outer electrode, and said target being maintained at ground potential.

6. The apparatus of claim 2, wherein said lens is a lens of the magnetic field type having a magnetic pole face, said means for producing a retarding electric field comprises a retarding voltage applied to said pole face, and said target being maintained at ground potential.

7. The apparatus of claim 2, wherein said secondary electron detector includes a microchannel plate.

8. The apparatus of claim 2, wherein said secondary electron detector comprises a scintillator, an optical fiber, and a photomultiplier.

9. The apparatus of claim 2, wherein said auxiliary electrode is formed conically.

10. An apparatus using a charged-particle beam, comprising:
    an emitter generating a charged-particle beam;
    an accelerating electrode for accelerating the beam;
    a lens for focusing the accelerated beam onto a target;
    a means for producing a retarding electric field between the lens and the target;
    an auxiliary electrode which is disposed between the lens and the target, the potential of the electrode being slightly low compared with that of the target; and
    a secondary electron detector disposed between the auxiliary electrode and the target.

11. An apparatus using a charged-particle beam, comprising:
    an emitter generating a charged-particle beam;
    an accelerating electrode for accelerating the beam;
    a lens for focusing the accelerated beam onto a target;
    a means for producing a retarding electric field between the lens and the target;
    an auxiliary electrode which is disposed between the lens and the target and maintained at substantially the same potential as the target; and
    a field-moderating electrode disposed between the lens and the auxiliary electrode.

* * * * *

UNITED STATES PATENT AND TRADEMARK OFFICE
CERTIFICATE OF CORRECTION

PATENT NO. : 4,918,358
DATED : April 17, 1990
INVENTOR(S) : Ryuzo Aihara and Haruo Kasahara It is certified that error appears in the above-identified patent and that said Letters Patent is hereby corrected as shown below:

Column 2 Line 33 "+" should read -- - -- (minus).

Column 3 Line 48 after "30" insert --,--.

Column 3 Line 51 after "potential" delete --35--.

Column 3 Line 54 "microcrochannel" should read --microchannel--.

Signed and Sealed this

Eighteenth Day of June, 1991

Attest:

HARRY F. MANBECK, JR.

Attesting Officer

Commissioner of Patents and Trademarks